United States Patent
Chen et al.

(10) Patent No.: US 7,023,593 B2
(45) Date of Patent: Apr. 4, 2006

(54) APPARATUS FOR FORMING NANO-GRATING DEVICE

(75) Inventors: Yung-Hsin Chen, Hsinchu (TW); Wann-Ding Tyan, Hsinchu (TW); Pong Lai, Hsinchu (TW); Ying-Tsung Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/801,526

(22) Filed: Mar. 17, 2004

(65) Prior Publication Data

US 2005/0117187 A1   Jun. 2, 2005

(30) Foreign Application Priority Data

Nov. 28, 2003   (TW) .............................. 92133480 A (51) Int. Cl.
*G03H 1/04* (2006.01)
(52) U.S. Cl. ............................ 359/35; 359/30; 359/566
(58) Field of Classification Search ................. 359/35, 359/30, 34, 12, 1, 558, 566
See application file for complete search history.

(56) References Cited

U.S. PATENT DOCUMENTS

| | | | |
|---|---|---|---|
| 6,185,019 B1 * | 2/2001 | Hobbs et al. | 359/30 |
| 6,687,196 B1 * | 2/2004 | Ueyanagi | 369/13.33 |
| 2003/0169671 A1 * | 9/2003 | Saimi et al. | 369/112.23 |
| 2004/0032667 A1 * | 2/2004 | Gale et al. | 359/642 |
| 2004/0239954 A1 * | 12/2004 | Bischoff | 356/635 |

* cited by examiner

*Primary Examiner*—Fayez G. Assaf
(74) *Attorney, Agent, or Firm*—Birch, Stewart, Kolasch & Birch, LLP (57) ABSTRACT

An apparatus for forming a nano grating device to film nano-scale interference fringes by holography in order to makes a nano-scale meshed structure is disclosed. A beam emitted form a light source passes subsequently through a beam splitter and two reflectors to reach at symmetrically mounted light emitting modules. The light emitting modules generate two beams passing along the same optical paths and then projecting on a photosensitive substrate that is attached on a hemi-sphere lens. Thus, a first set of interference fringes are formed. Then, the substrate rotates with an angle and then is subjected to exposure to form a second set of interference fringes crossing the first set of interference fringes. Thereby, a nano-scale meshed structure is obtained.

6 Claims, 9 Drawing Sheets

APPARATUS FOR FORMING NANO-GRATING DEVICE

This Non-provisional application claims priority under 35 U.S.C. § 119(a) on Patent Application No(s). 092133480 filed in Taiwan on Nov. 28, 2003, the entire contents of which are hereby incorporated by reference.

BACKGROUND OF THE INVENTION

1. Field of Invention

The present invention relates to an apparatus for forming a nano-grating device, and more particularly to an apparatus for forming a nano-grating device by retrieving nano-scale interference fringes using a holography process.

2. Related Art

A holography is based on the visual effect generated by optical interference and diffraction. In practice, two highly coherent beams (usually, laser beams) are used to interfere with each other to form a plurality of interference fringes that are then recorded on a photosensitive material and then developed.

In recent years, the holography has been widely used in various fields such as Display Holography which provides 3-D images, holographic data access, holographic cameras, and the formation of grating devices and so on. By means of imposing the grating devices with different angles, a filter that can filter and save particles can be made.

A cause of Serious Acute Respiratory Symptom (SARS) that has swept across the world and has become a statutory infectious disease is a deformed coronavirus that spreads over through breathing in flying particles of the saliva or phlegm of a sick person. Therefore, people can effectively avoid SARS by avoiding any contact with spatters or mists spray of the sick person.

Therefore, the people or doctors and nurses who often contact the sick persons need to wear masks to filter virus, bacteria or dust particles to prevent the infection of SARS.

However, the currently available active carbon masks can filter large-molecule dusts, viruses, toxic gases and peculiar smells, but small-molecule (30 nanometers–300 nanometers) viruses cannot be filtered.

In fact, professional medical N-95 masks only filter 95% fine particles (300 nanometers–90 nanometers). The coronavirus and paramyxovirus (100 nanometers–300 nanometers), and SARS virus (80 nanometers–160 nanometers) cannot be completely filtered.

For the application of the holography in taking grating images, the grating cycle cannot be below 100 nanometers due to the limitation of the laser (i.e., the diffraction limitation restricts the grating cycle to be higher than half of a light wave of the laser).

Therefore, there is a need of a filtering structure for making a mask that can filter viruses and bacteria to protect the people from being infected.

SUMMARY OF THE INVENTION

It is therefore an object of the invention to provide an apparatus of forming a nano-grating device. A holography is used to form a grating device on a photosensitive substrate. The device has a cycle of smaller than 100 nanometers. The photosensitive substrate is then exposed after rotating with a predetermined angle to form a nano-scale (smaller than 100 nanometers) meshed structure that can filter viruses, bacteria and dust etc. or capture a substance to be measured (such as DNA) in biochemistry.

The apparatus for forming the nano grating device includes a light source, two light splitters, two reflectors, a light emitting module, a hemi-sphere lens and a photosensitive substrate.

Light beams are divided into two sub-beams by a spectrophotometer. The sub-beams are respectively reflected by their corresponding reflectors and then reach at corresponding light emitting modules that have the same magnification. The light emitting module includes a magnification subject glass, a filtering pinhole and a lens.

The sub-beams travel in parallel and scatter or focus after passing through the light emitting modules. After the sub-beams travel for a predetermined distance, they are reflected to the photosensitive substrate attached onto the hemispheral lens. The substrate is subjected to exposure for several seconds to define a plurality of interferometric fringe patterns, thereby forming the nano grating device with a cycle of smaller than 100 nano-meters.

When the nano-scale meshed structure is formed for mask application, the photosensitive substrate rotates a predetermined angle to be subjected to an exposure. Thereby, a nano-scale meshed structure is obtained.

The nano-scale meshed structure is electroformed into a metallic mesh or a mold via which a plurality of plastic mesh can be mass produced by projection molding. In forming the mask, the metallic or plastic mesh is sandwiched in the mask for filtering nano-scale particles, bacteria or viruses.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
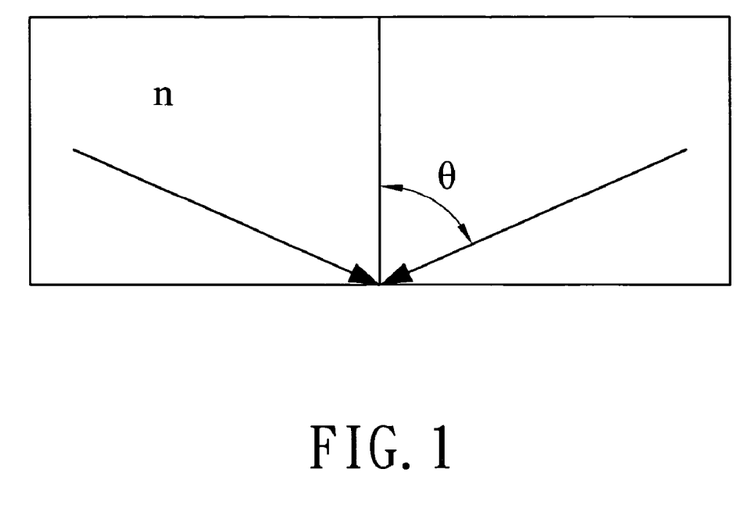
FIG. 1 is a schematic view of the symmetric interference of light in a medium with a refractive index n.

The speed of light in a different medium is c/n, wherein c is light speed and n is the refractive index. As shown in FIG. 1, when the refractive index of the medium is adjusted for symmetric interference, the interference cycle T varies as the following formula (1):

$$T = \lambda_\alpha / 2n \sin \theta \quad (1)$$

wherein $\lambda_\alpha$ is a wavelength of light in the air, n is a refractive index of the medium and $\theta$ is an interference angle.

For example, when a laser has a wavelength of 442 nanometers as the light source, a glass with a refractive index of 1.5 is used as the medium to form a grating structure with the interference cycle T of 160 nanometers. The interference angle is obtained according to the above formula (1).

Figure 2:
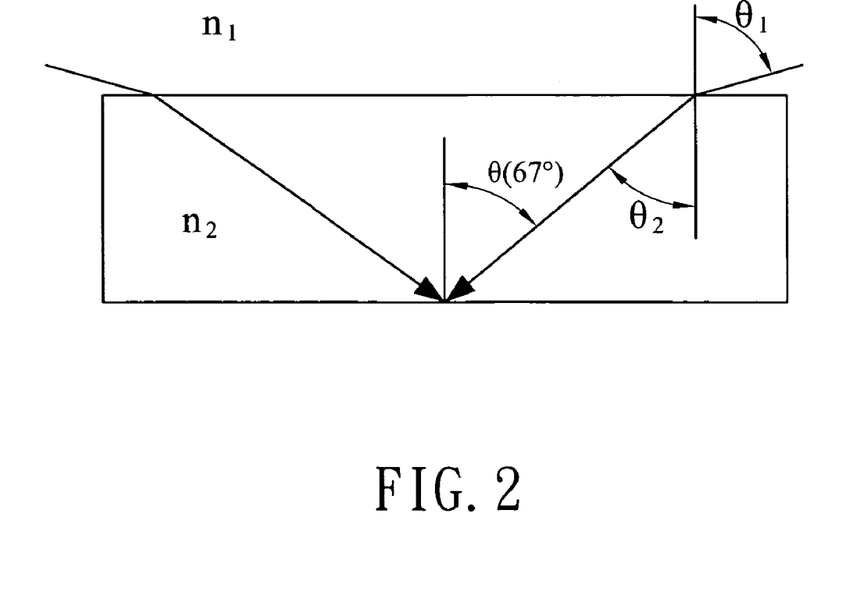
FIG. 2 is a schematic view showing the light incident to the glass from the air.

Referring to FIG. 2, the light travels at the interference angle $\theta$ of 67° through the glass 10 with a refractive index of 1.5. According to Snell's law as shown in the following formula (2), the refractive index $n_1$ of air is 1 and the refractive index $n_2$ of glass is 1.5, $$n_1 \sin \theta_1 = n_2 \sin \theta_2 \quad (2)$$

Sin $\theta_1$ equals to 1.5 which is not mathematically logic because Sin $\theta_1$ is impossible to be larger than 1. Therefore, the light cannot go in the glass in this way.

Figure 3:
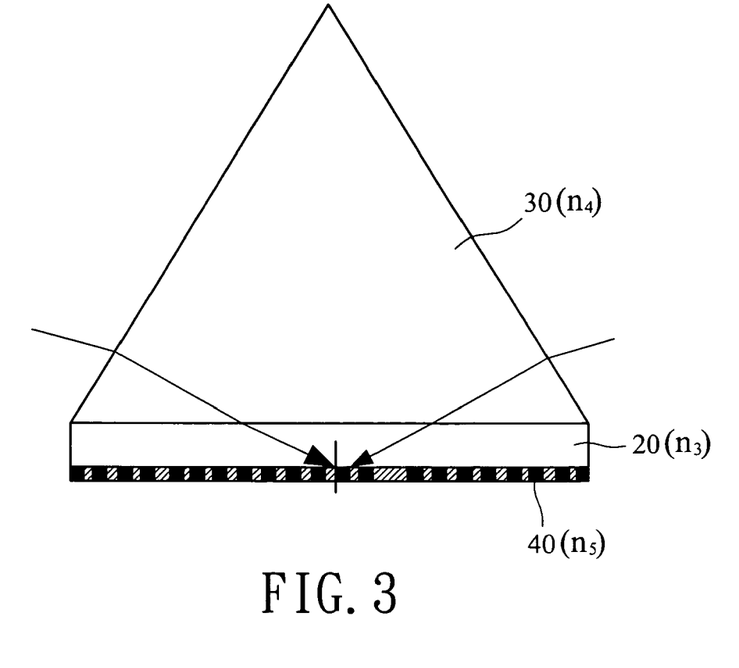
FIG. 3 is a schematic view of relative positions of a glass substrate, a prism and a photoresist layer.

Referring to FIG. 3, a prism 30 is mounted on a glass substrate 20 to introduce the light into the glass substrate 20. Furthermore, a photoresist layer 40 is formed over a side of the substrate 20. The glass gas has a refractive index $n_3$, the prism 30 has a refractive index $n_4$ and the photoresist layer 40 has a refractive index $n_5$.

Figure 4:
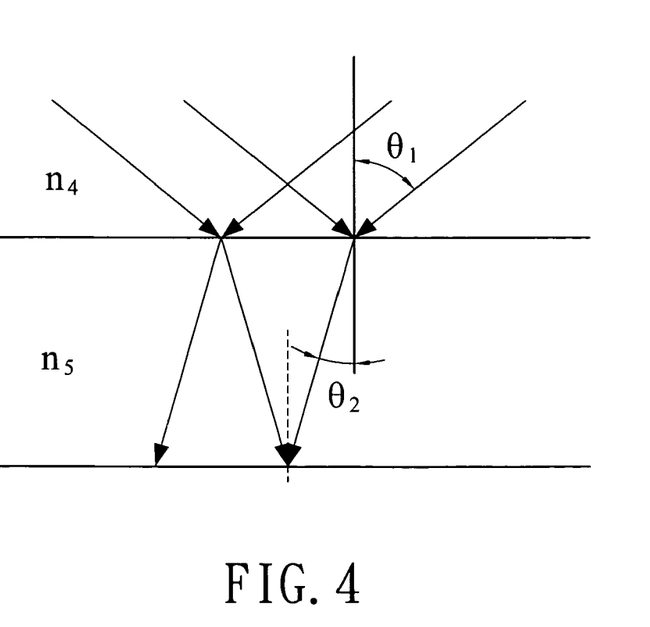
FIG. 4 is a schematic view of optical paths of two beams traveling through media at a constant incident angle.

When two beams pass through different media at a constant incident angle, the formed interference cycle calculated according to the formulae is $T_4 = \lambda / 2n_4 \sin \theta_1$. Thereby, the substrate 20 and the photoresist layer 40, where the beams cross, form fringes with the same cycle.

Figure 5:
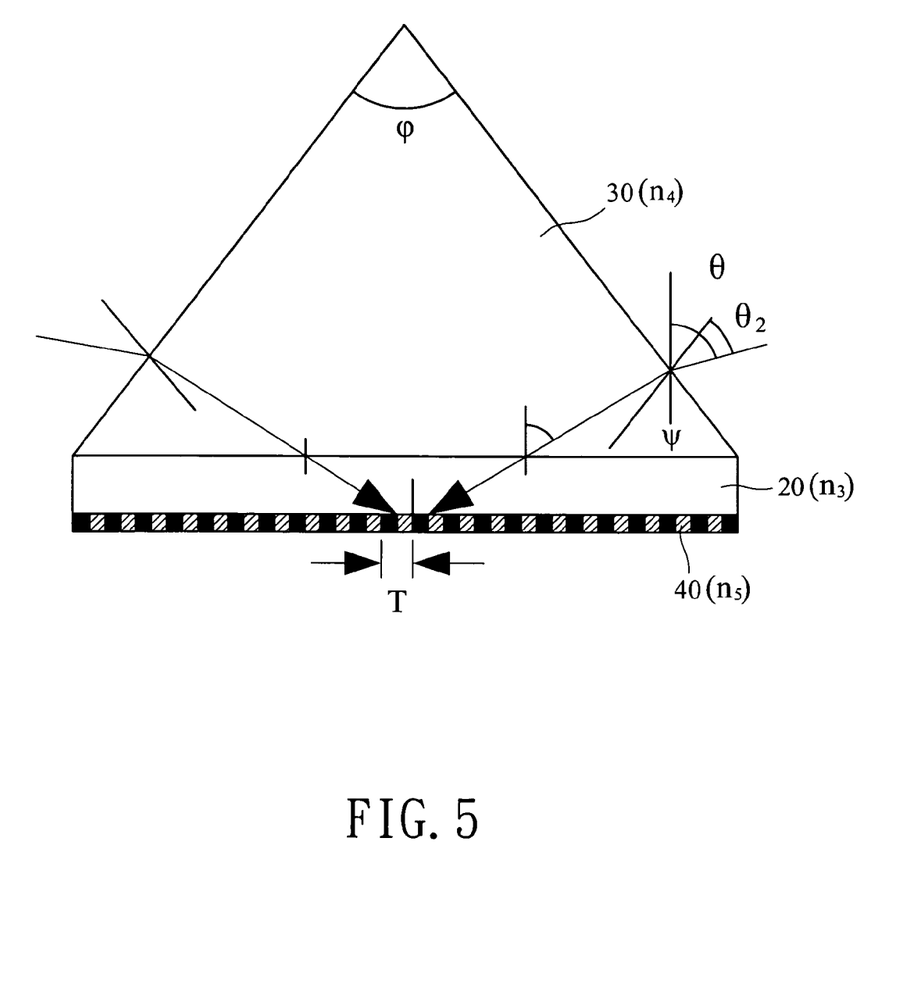
FIG. 5 is a schematic view of relative positions of a glass substrate, a prism and a photoresist layer.

Referring to FIG. 5, it is preferred to calculate the angle $\theta$ between the incident light and a normal line of an interference plane for building optical paths. The angle $\theta$ between the incident light and a normal line of an interference plane is expressed by formula (3) and (4):

$$\theta = \phi + \sin^{-1}\{\lambda \cos \phi / 2T - n_1 \sin \phi \sqrt{1-(\lambda/2n_1 T)^2}\} \quad (3)$$

$$\theta_2 = \theta - \phi = \theta + \phi / 2 - 90 \quad (4)$$

$\lambda$: a wavelength of the incident light
$n_4$: the refractive index of an isosceles prism 30
$\phi$: a base angle of the isosceles prism 30
$\phi$: an interior angle of the isosceles prism 30
T: the cycle of interference grating For a right-angle prism as an example: when the incident light has a wavelength of 442 nanometers and the base angle $\phi$ of the isosceles prism is 90° to form a grating structure with a cycle of 160 nanometers, the incident angle is $\theta_2$ of 31.1899° according to formula (3) and (4).

Figure 6:
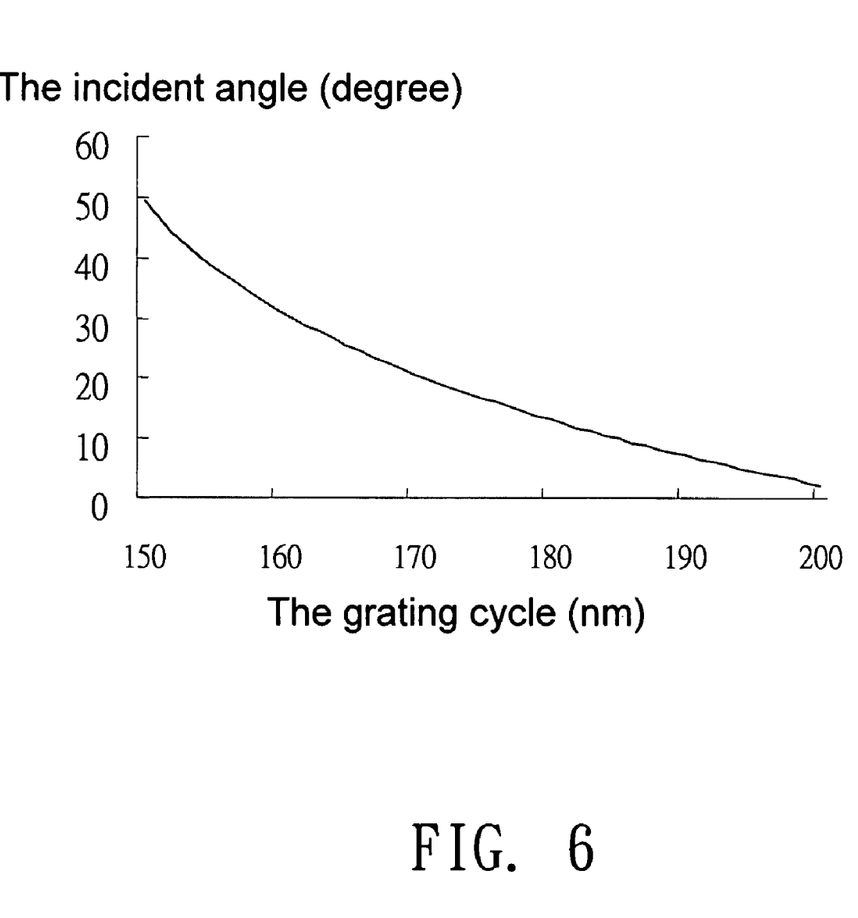
FIG. 6 is a graph showing the relationship between the incident angle and the grating cycle under a condition that an isosceles prism has an interior angle of 90 degrees.

FIG. 6 is a graph illustrating the relationship between the incident angle and the grating cycle when the interior angle $\phi$ of the isosceles prism 30 is 90°.

Figure 7:
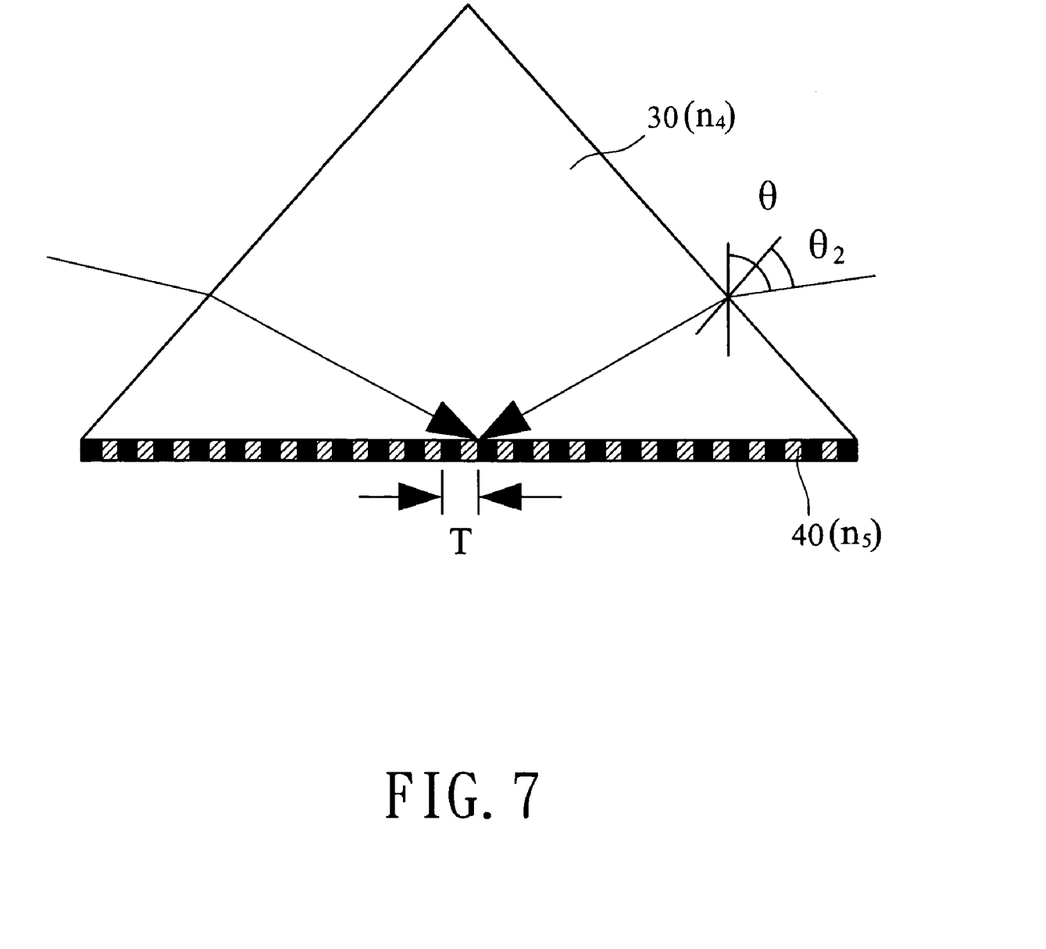
FIG. 7 is a schematic view of optical paths of a light incident to the prism from the air.

In order to prove the above theory can be put into practice, the photoresist layer 40 is directly applied over one side of the isosceles prism 30 and then the grating cycle is measured.

In this experiment, the parameters are as follows: the refractive index of the isosceles prism 30 is 1.52607, the base angle of the isosceles prism 30 is 45°, the wavelength of the incident light is 442 nanometers, and the grating cycle is 160 nanometers. The value $\theta$ is 76.089° and the incident angle $\theta_2$ is 31.189° according to the formula (3).

The photoresist layer 40, such as Shipley S1805, applied on the side of the isosceles prism 30 has a thickness of about 200–300 nanometers. The photoresist layer 40 is heated in a oven at 90° C. for 20 minutes, and then subjected to exposure.

There are two ways to perform the exposure process according to the conditions of the light sources. One is spot-exposure in which the laser is not expanded. The other is that the laser is expanded.

Then the exposed photoresist layer 40 is developed, baked at 100° C. for 30 minutes and subjected to proper processing to form the grating structure.

Figure 8:
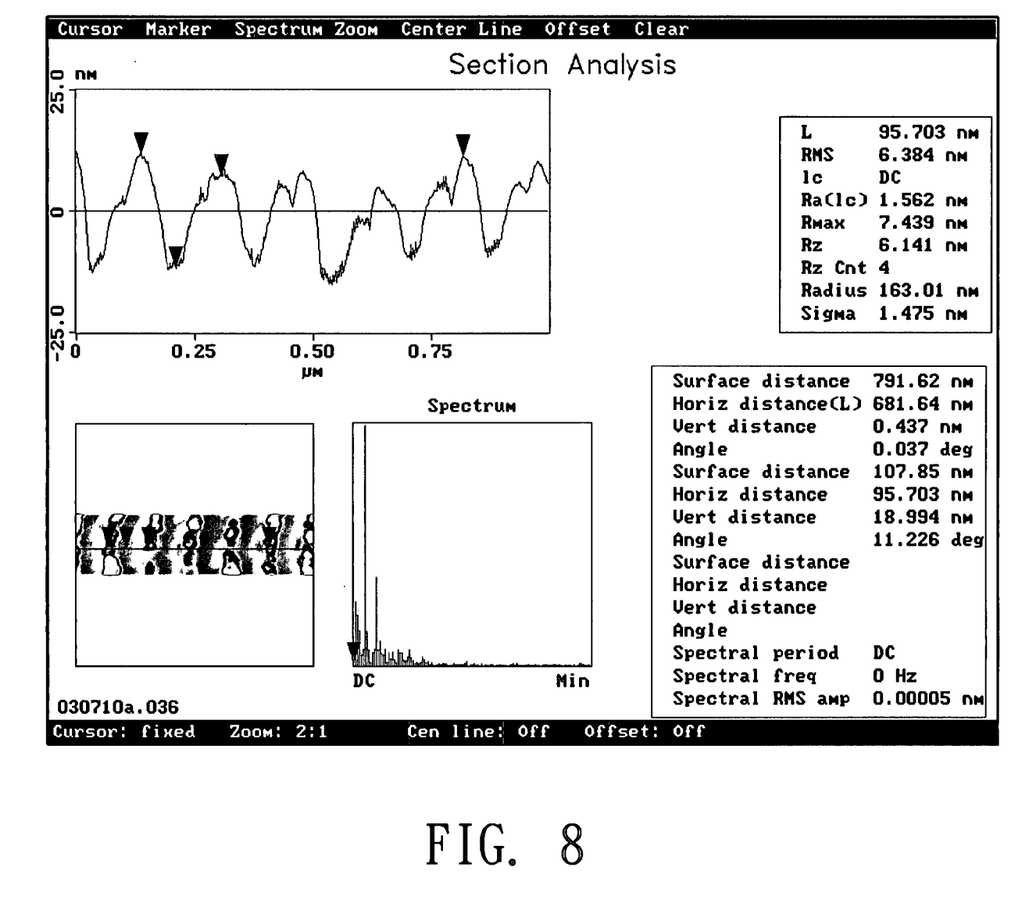
FIG. 8 is a graph of experimental data obtained by an atomic force microscope (AFM) under different exposure conditions (unexpanded laser)
Figure 9:
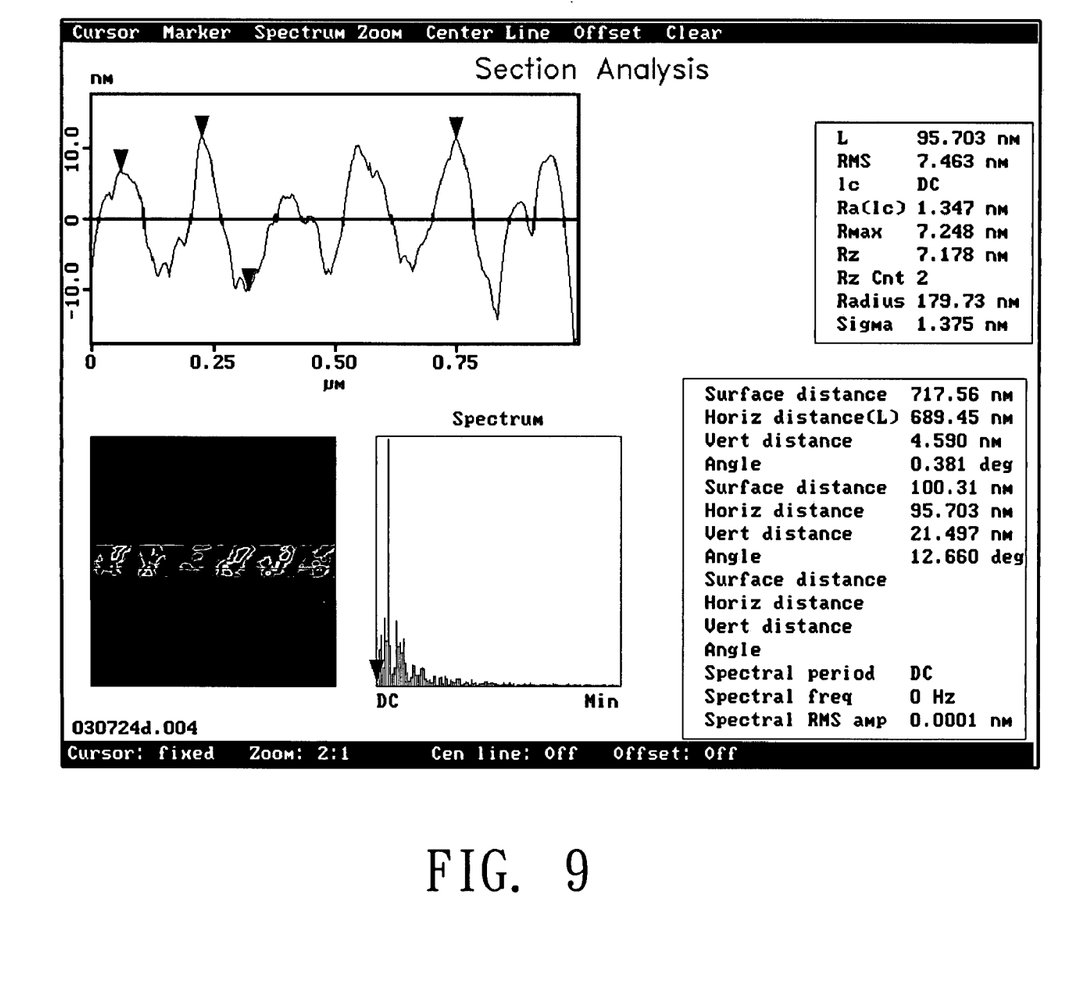
FIG. 9 is a graph of experimental data obtained by an atomic force microscope (AFM) under different exposure conditions (expanded laser)

FIG. 8 and FIG. 9 are graphs of experimental data obtained by an atomic force microscope (AFM) under different exposure conditions (expanded laser and unexpanded laser).

In FIG. 8, by means of the AFM accompanying with a appropriate application software, the photoresist layer 40 is spot-exposed by the unexpanded laser to form the grating structure with the cycle of 165 nanometers.

In FIG. 9, the grating cycle formed by the spot-exposure of the expanded laser is 172 nanometers (there may be an inaccuracy caused by non-perfect vertical alignment).

From the above grating cycle, it is calculated that a filter with mesh of the grating structures is capable of filtering particles, virus or bacteria of about 80 nanometers. Therefore, the grating structure of the invention breaks through the limit in the prior art to achieve the filtering of particles, bacteria or viruses of below 100 nanometers.

From the result of the above experiment, no matter the laser is expanded or not, the laser passes through the medium with a refractive index greater than 1 to form the grating structure with a cycle smaller than 0.5 times of the wavelength in the air. Although there are some particle noises or cracks in the photoresist layer 40 in this experiment, which may be caused by scattered light from the prism or caused by an inherent characteristic of the photoresist layer 40, the practicability of forming the nano grating structure of the invention is not affected.

The device for forming the nano grating structure of the invention is an optical system configured according to the above theory. That is, the device configured according to the above theory can form a grating structure with a cycle smaller than 100 nanometers.

Figure 10:
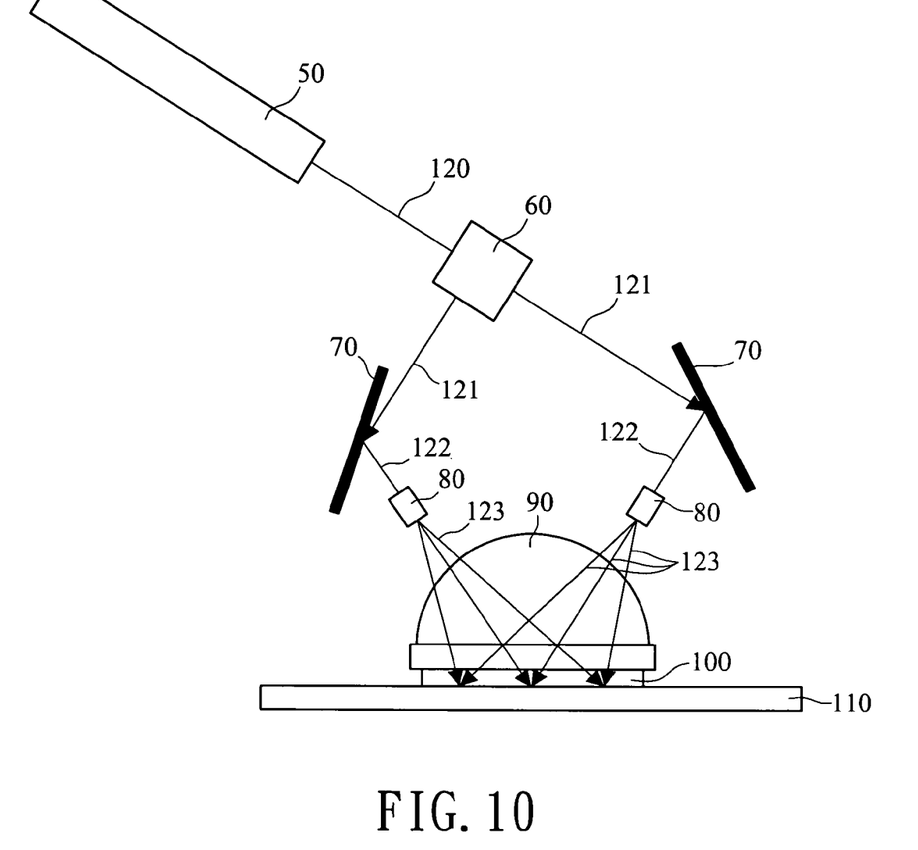
FIG. 10 is a schematic view of a system for forming a nano grating device according to one embodiment of the invention.

FIG. 10 is a schematic view of a device for forming the nano grating structure according to one embodiment of the invention. The device for forming the nano grating structure includes a light source 50, a beam splitter 60, reflectors 70, light emitting modules 80, a hemi-sphere lens 90, a photosensitive substrate 100 and a movable platform 110.

The light source 50 is used to emit a first beam 120. In holography applications, the light source is usually a laser.

The beam splitter 60 is mounted on one side of the light source 50 to split the first beam 120 emitted from the light source 50 into two second beams 121.

The reflectors 70 are mounted on the splitter 60 opposite to the light source 50 to respectively receive the second beam 121 generated by the light splitter 60 and then respectively reflect a third beam 122.

The light emitting modules 80 are mounted on the reflectors 70 opposite the light splitter 60 to respectively receive the third beams from the reflectors 70 and generate a fourth beam 123.

The light emitting modules 80 are symmetrically mounted at either sides of the hemi-sphere lens 90 to allow the fourth beams 123 to travel along the same optical paths and then project on the substrate 100.

Figure 11:
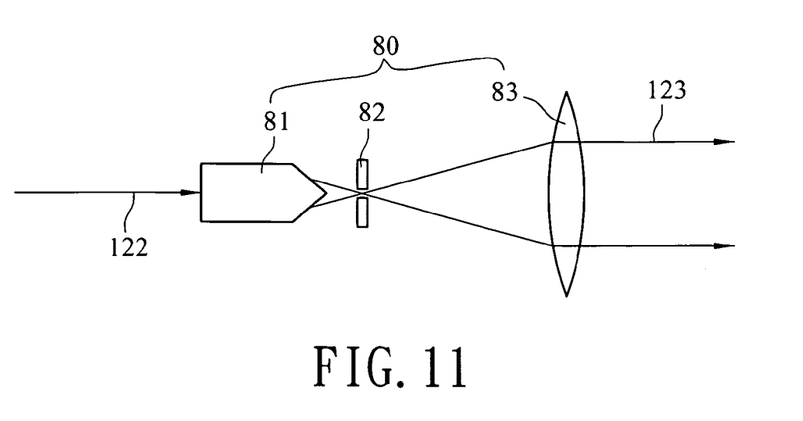
FIG. 11 is a schematic view of a light emitting module according to one embodiment of the invention.

If the laser is expanded for exposure, then the amplification of the light emitting modules need to be the same. Referring to FIG. 11, each light emitting module 80 includes an amplifying object lens 81, a filtering pinhole 82 and a lens 83.

The third beams 122 subsequently pass through the amplifying object lens 81, the pinhole 82 and the lens 83 to generate parallel light, scattered light or focus light that is referred to as fourth beams 123.

The hemi-sphere lens 90 is a lens having a shape of hemi-sphere and a flat surface 91. The hemi-sphere lens 90 is mounted on each light emitting module 80 opposite the reflector 70. The substrate 100 is attached onto the flat surface 91.

Figure 12:
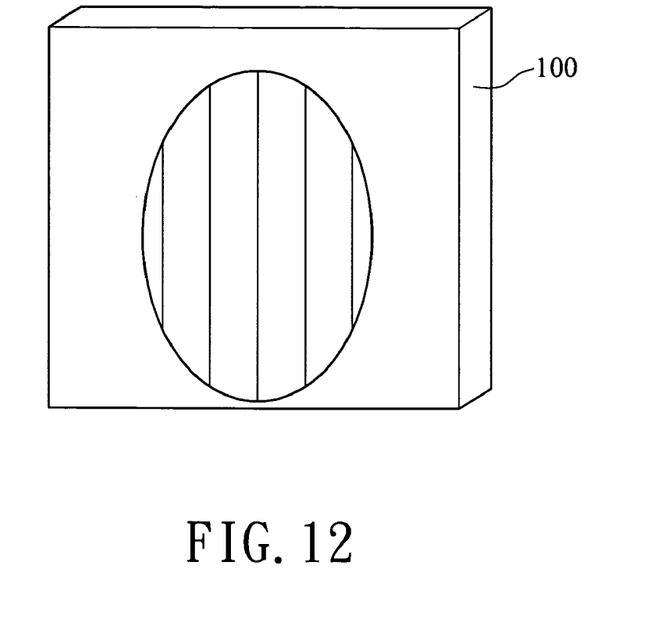
FIG. 12 is a schematic view of a nano grating structure formed by the apparatus for forming a nano grating device according to one embodiment of the invention.

The fourth beam 123 travels along the optical path to reach at the substrate 100. The fourth beam 123 superimposes each other and then the exposure is performed for several seconds to form a plurality of interference fringes as shown in FIG. 12.

Figure 13:
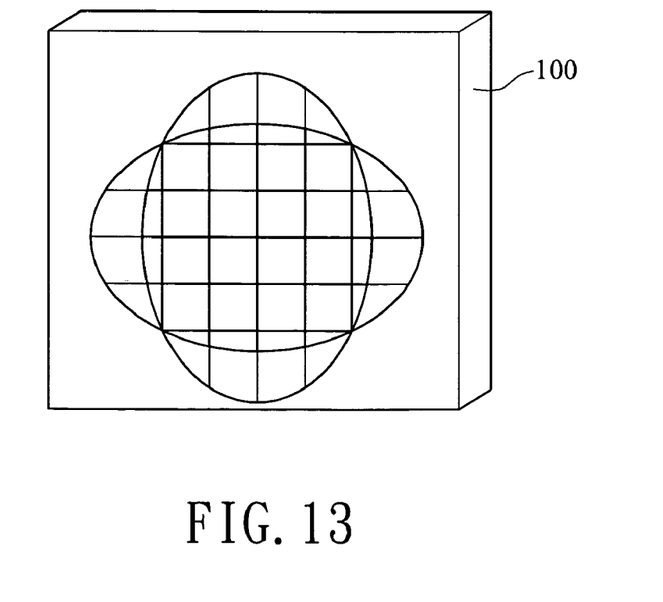
FIG. 13 is a schematic view of a meshed structure obtained after rotating and exposing a photosensitive substrate.

Referring to FIG. 13, when a filter is formed, only the movable platform 110 needs to rotate the substrate 100 with 90 degrees or certain degrees. After exposure, other interference fringes are formed across the previously formed fringes to construct a mesh structure.

The meshed structure formed on the substrate can be further electroformed into a metallic mesh for use in a virus or bacteria filter. The dimension of the mesh is smaller than 100 nanometers.

Alternately, the meshed structure in FIG. 13 is electroformed into a mold, which is used to mass produce plastic mesh by projection molding.

When a nano-scale mask is formed, only the above metallic or plastic mesh needs to be sandwiched in the mask.

In other variants of the invention, the device of forming the nano grating structure retrieves images of the grating structure via optical fibers, and performs the subsequent processing such as electroforming to complete the nano-scale meshed structure.

If the optical fibers are used for the transmission of beams, the components of the system are the same as the above, except the light splitter 60. The splitter can be optical fibers for splitting the first beam 129 into the two sub-beams.

The fourth beam 123 travels along the optical path to reach the substrate 100. The fourth beam 123 superimposes each other and then the exposure is performed for several seconds, to form a plurality of interference fringes.

The movable platform 110 needs to rotate the substrate 100 with 90 degrees or certain degrees. After another exposure, a mesh is formed, on which interference fringes interlace with 90 degrees or certain degrees.

The meshed structure formed by the device of the invention can be used to make a filtering device for filtering nano-scale organics or inorganics such as viruses, cells, dusts etc. or for picking up a target substance such as DNA to be chemically or biologically tested.

It will be apparent to the person skilled in the art that the invention as described above may be varied in many ways, and notwithstanding remaining within the spirit and scope of the invention as defined in the following claims.

What is claimed is:

1. An apparatus for forming a nano grating device, comprising:
    a light source, used to emit a first beam;
    a beam splitter, mounted on one side of the light source to split the first beam emitted from the light source into two second beams;
    two reflectors, mounted on the other side of the splitter opposite to the light source to respectively receive the second beams generated by the light splitter and then reflect a third beam;
    two light emitting modules, mounted on the other side of the reflectors opposite to the light splitter to respectively receive the third beams from the reflectors and generate a fourth beam; and
    a hemi-sphere lens, having a flat surface and being mounted on the other side of the light emitting modules opposite to the reflectors, a photosensitive substrate is attached onto the flat surface, and each of the fourth beam travels along the same optical paths to reach the photosensitive substrate that is later exposed to form a grating structure;
    wherein after the grating structure is formed on the photosensitive substrate, rotating and exposing the photosensitive substrate to form another grating structure crossing the grating structure that constructs a filter.

2. The apparatus of claim 1, wherein the light source is a laser.

3. The apparatus of claim 1, wherein the beam splitter is an optical fiber for splitting the first beam into two beams.

4. The apparatus of claim 1, wherein the light emitting modules respectively include an amplifying object lens, a filtering pinhole and a lens, the third beams pass subsequently through the amplifying object lens, a filter pinhole and the lens to respectively form a fourth beam.

5. The apparatus of claim 1, wherein the two light emitting modules are symmetrically mounted at either sides of the hemi-sphere lens to allow the fourth beams to travel the same optical paths and then project on the photosensitive substrate.

6. The apparatus of claim 1, further comprising a movable platform to move the photosensitive substrate.

* * * * *